(12) United States Patent
Pourrahimi et al.

(10) Patent No.: US 7,275,301 B2
(45) Date of Patent: Oct. 2, 2007

(54) METHOD FOR REINFORCING SUPERCONDUCTING COILS WITH HIGH-STRENGTH MATERIALS

(76) Inventors: Shahin Pourrahimi, 1272 Beacon St., Brookline, MA (US) 02446; Nadder Pourrahimi, 24 Whitman Rd., #1-3, Waltham, MA (US) 02453

( * ) Notice: Subject to any disclaimer, the term of this patent is extended or adjusted under 35 U.S.C. 154(b) by 145 days.

(21) Appl. No.: 10/324,260

(22) Filed: Dec. 23, 2002

(65) Prior Publication Data

US 2003/0121696 A1 Jul. 3, 2003

Related U.S. Application Data

(63) Continuation-in-part of application No. 10/056,551, filed on Jan. 24, 2002, now Pat. No. 6,534,718.

(51) Int. Cl.
*H01L 39/24* (2006.01)

(52) U.S. Cl. .......................... 29/599; 29/825; 29/33 F; 174/125.1; 505/231; 505/430

(58) Field of Classification Search ................ 29/599, 29/825, 887, 33 C, 33 M; 174/15.4, 15.5, 174/125.1; 428/373, 930; 505/230–232, 505/430, 431, 433, 434, 700
See application file for complete search history.

(56) References Cited

U.S. PATENT DOCUMENTS

| 3,714,371 | A | * | 1/1973 | Nomura et al. | .......... 174/125.1 |
| 3,767,842 | A | * | 10/1973 | Bronca et al. | .......... 174/125.1 |
| 4,757,161 | A | * | 7/1988 | Wilhelm et al. | .............. 29/599 |
| 5,364,709 | A | * | 11/1994 | Yu | ............................... 29/599 |
| 5,424,282 | A | * | 6/1995 | Yamamoto et al. | ......... 505/433 |
| 6,199,266 | B1 | * | 3/2001 | Meserve | ...................... 29/599 |

* cited by examiner

*Primary Examiner*—Minh Trinh
*Assistant Examiner*—Donghai D. Nguyen
(74) *Attorney, Agent, or Firm*—David Prashker

(57) ABSTRACT

A method for manufacturing clad superconducting wire for use in superconducting coils, such wire having improved resistance to electromagnetic forces by using composite superconducting wires that are clad with selected high-stiffness high-strength materials.

20 Claims, 3 Drawing Sheets

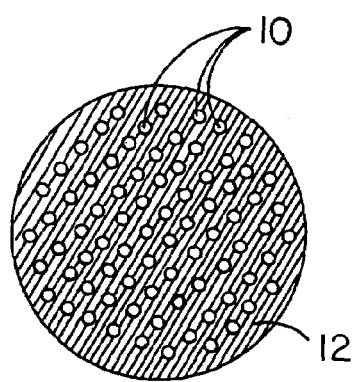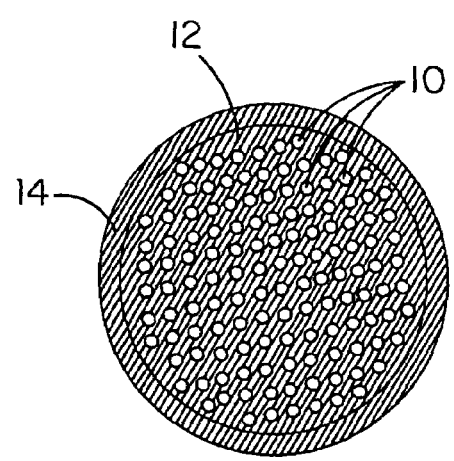
FIG. 1
PRIOR ART
FIG. 2

METHOD FOR REINFORCING SUPERCONDUCTING COILS WITH HIGH-STRENGTH MATERIALS

This application is a continuation-in-part of U.S. patent application Ser. No. 10/056,551 filed Jan. 24, 2002, now U.S. Pat. No. 6,534,718 issued Mar. 18, 2003

BACKGROUND TO THE INVENTION

1. Field of the Invention

The present invention resides in the field of superconducting coils and more particularly relates to the reinforcement of superconducting coil magnets using composite superconducting wires that are clad with high-strength materials.

2. History of the Prior Art Superconductivity is the phenomenon where, when a particular material, such as a wire, is subjected to successively colder temperatures, it undergoes a state transition where all electrical resistance disappears, i.e. the material can conduct electricity without generating any heat. At this stage the material is said to have become a superconductor. This phenomenon only occurs for specific metals/alloys and compounds. The state of superconductivity for a given superconductor is a function of its temperature, background magnetic field, and transport electric current. Superconducting magnets almost exclusively consist of windings of supercdnducting wire, also known as coils. In very large magnets the "wire" may take the form of cabled superconducting wires. For some superconducting magnets the cable of wires is contained, together with helium for cooling, in a metal conduit. All wires used in building such magnets include insulation that surrounds the wire to be wound. Turns and layers of the winding of a magnet are often bonded to each other by a bonding agent, such as epoxy. Such windings are said to be impregnated.

In many superconducting magnet applications, for example in nuclear magnetic resonance (NMR) and for magnetic resonance imaging (MRI), the windings are usually solenoids. Often NMR and MRI magnets are comprised of a number of solenoid coils that are electrically connected. The magnetic fields produced by the system of coils combine to produce an intended magnetic field intensity over an intended volume inside the system of coils of the magnet. The field intensity of a solenoid, as well as most other magnet configurations, scales with the number of turns of the wire that makes up the windings of the coil and the electric current (amperes) that passes through the wire. Often it is said that the field intensity scales with "ampere-turns." For reasons of: 1) minimizing space, 2) using less superconducting wire, and more importantly 3) reducing the stored energy of the coil, most coils used in magnets with high stored energy such as NMR and MRI magnets are designed and built such that a given coil is as compact as possible.

When current passes through the wire of a coil, a magnetic field is produced. When current passes through a system of coils, a combined magnetic field is produced. The magnetic field (B) which is produced by a coil or a system of coils around a given turn inside the winding volume (pack) of a coil interacts with the current in the wire and produces a force on the wire, referred to as the Lorentz Force. Because the orientation of the magnetic field varies according to the location of the turn within the coil, or system of coils, the direction of the force varies also. The Lorentz Forces are balanced by the wire and other materials that make up the coil, resulting in mechanical stresses in the wire. In a given solenoid coil the Lorentz Forces on the turns combine to produce two components of stress in the wire. A tensile hoop stress is developed in the wire of magnitude $B_x I_x R$ where B is the local field strength, I is the current and R is the radius of curvature. A transverse stress is also incident because radial components of the field in regions of a winding produce an axial force. Of these components of stress the hoop stress is generally the more significant, but both must be considered in the structural design of a high field magnet. When a solenoid coil is charged by current passing through it, there is a balance between its electromagnetic energy and mechanical elastic energy. Therefore a charged coil, or a system of coils, stores energy.

Design parameters and conventional approaches to solenoid design are discussed, for example, in: *Superconducting Magnets*, M. N. Wilson, Oxford University Press, New York, N.Y. (1983) and *Case Studies in Superconducting Magnets*, Y. Iwasa, Plenum Press, New York, N.Y. (1994).

The stresses on the wires inside many superconducting coils may reach hundreds of MPa. Therefore a main part of the design optimization of coils is calculation of stresses and bearing of the stresses by the coil.

To achieve the highest possible fields inside the bore of many magnets, for example the NMR and MRI magnets, and most effectively support against Lorentz Forces, the wires used in these magnets are usually a solid monolithic wire, and their winding packs are devoid of any space for helium which is sometimes used as a heat sink inside the winding pack of some superconducting magnets. The coils of many superconducting magnets are comprised of solid matter. These are often referred to as being adiabatic coils as any release of local energy within the winding pack is absorbed by the winding pack itself first, and then it is transferred to the cooling medium that is external to the winding pack.

For reasons that relate to stability of superconductors, superconducting wires used in most magnet application are multifilamentary (MF) composites. [see for example *Stability of Superconductor*, by Lawrence Dresner, Plenum Press, New York, N.Y., 1995]. The superconducting filaments in MF wires in use in most superconducting magnets today are made from niobium-titanium (Nb—Ti) alloy. The Tc and $Bc_2$ for Nb—Ti are about 10 Kelvin (K) and about 10 (T), respectively. Nb—Ti alloy is ductile and its use in fabricating MF wires, and subsequently in a magnet, is straightforward and comparatively less expensive than using other materials. MF Nb—Ti composite wires are often comprised of Nb—Ti filaments inside a copper or copper alloy matrix.

Superconducting magnets for operation at fields higher than about 10 T rely principally on the use of type A15 superconductors. Among the A15 superconductors the $Nb_3Sn$ based wires are most practical for large-scale production, basically due to the fact that fabrication of $Nb_3Sn$ is economical and less complicated. Almost all operating A15 magnets to date have used $Nb_3Sn$ conductors. The Tc and $Bc_2$ for $Nb_3Sn$ are about 18 Kelvin (K) and about 23 (T), respectively. Other A15 superconductors, such as $Nb_3Al$, that have better superconducting properties than $Nb_3Sn$ are under development.

$Nb_3Sn$, like other A15 phases, is an intermetallic compound and is inherently brittle. Therefore it does not lend itself to normal conductor fabrication methods where a given material undergoes significant plastic deformation.

For most applications in magnet technology, $Nb_3Sn$ superconductors are produced by a two-step process in which a multifilamentary composite wire, that contains Nb and Sn in separate regions, is formed into wire ($Nb_3Sn$ precursor wire) and then, during a subsequent reaction heat treatment at, for example 650 C-750 C, the $Nb_3Sn$ is formed by solid state reaction. MF $Nb_3Sn$ composite wires are often comprised of $Nb_3Sn$ filaments inside a copper and bronze alloy matrix. Because $Nb_3Sn$ is brittle, windings of $Nb_3Sn$ wire are often produced by winding un-reacted wires and then heat-treating the winding as a whole. This approach is referred to as the wind-then-react method. If the winding diameter is large enough the winding can be performed using a reacted $Nb_3Sn$ wire. This approach is referred to as react-then-wind method. Because MF $Nb_3Sn$ wires have to be heat-treated at temperatures of 650 C-750 C, the non-superconducting matrix in the wires which is most often copper or bronze is in a fully annealed state and is therefore mechanically weak and cannot contribute much to the bearing of Lorentz Forces. Therefore it is particularly desirable to reinforce $Nb_3Sn$ wires and coils for superconducting magnet applications.

A main challenge of design and manufacturing coils with high stored energy, for example for NMR and MRI magnets, is to minimize the size of the coils by using conductors that have enough superconducting material to provide the required ampere-turns and optimizing/minimizing structural material to bear the mechanical stresses.

Up to the present time the following methods have been used to reinforce the coils/wires of magnets that use MF wires:

a) extra cold worked (hard) copper has been incorporated into the wire wherein the non-superconducting part of a wire that carries no current is increased and therefore the ampere-turns for a given winding pack is decreased;

b) winding sections have been over-banded with a strong material, including steel, beryllium copper, carbon fiber, etc.; and c) attempts have been made to incorporate reinforcements in addition to the use of copper and copper alloys inside superconducting wires.

One disadvantage to the use of hard copper as the reinforcement is that the strength of hard copper is limited to about 40,000 psi (275 MPa) in consequence of which in many magnet windings more copper is needed for reinforcement than for stabilization. The result is a lower overall winding current density than could be obtained with the separation of functions, that is, enough copper for stabilization or quench protection and enough high-strength reinforcement for stress containment. A disadvantage of over-banding is that high radial strain in the active winding is needed to transfer the electromagnetic loads to the over-banding. The most efficient and compact winding is obtained when the reinforcement is distributed throughout the active winding. Variations in distributing reinforcement throughout the active winding, though, can create disadvantages inside a superconducting wire in that it complicates the wire manufacturing process for both Nb—Ti and $Nb_3Sn$ MF wires because the reinforcing material needs to be both mechanically compatible with the wire manufacturing process which limits the choice of materials as such materials must also be chemically inert to the chemistry of the superconducting wires.

SUMMARY OF THE INVENTION

It is an object of this invention to create coil windings having great resistance to the aforementioned stresses. In this invention a reinforcement is incorporated directly on a MF superconducting composite wire as cladding. This is done after MF superconducting wire fabrication is nearly completed. It is assumed that insulation is selected and applied appropriately on the superconducting wires. In this way, when the reinforced wire is wound into a coil, the structural support is well distributed throughout the winding.

The present invention also contemplates that adiabatic superconducting magnets are prone to instability arising from thermal transients within the winding. For example, when the bonding agent used in the winding pack of a coil cracks as a result of straining associated with cooling, motion against fixtures, or charging of the magnets, heat arises in the winding pack, producing a temperature pulse that diffuses into the superconducting material in the core of wire and may raise the temperature locally above the current sharing temperature. The result may be a premature loss of superconductivity referred to as quench. For a given heat pulse, the temperature rise is a function of the heat conductivity and heat capacity of the material affected by the heat pulse. In contrast to conventional winding packs that use copper or copper alloys on the surface of the wires, in this invention the wires are clad by materials of lower thermal conductivity, such as steel alloy, therefore the diffusion of heat into the core of wire will be impeded and heat diffused to a wider region affecting a relatively larger mass. For example, a steel-clad wire is more resistant to thermal transient than a wire with copper at the outer surface. Furthermore, steel being tough and rigid, protects the wire from abuse more efficiently than prior art outer surface materials, such as copper.

Cladding with an appropriate high-strength material is particularly apposite for a $Nb_3Sn$ wire which has been reacted before winding. Indeed, the clad $Nb_3Sn$ wire may make "react-then-wind" magnets much more practical than at present. It should be understood that $Nb_3Sn$ is discussed only as an example of A15 superconductor and the principals of invention apply to all MF A15 wires.

The method discussed here is also applicable to High Temperature Superconductors (HTS) including those belonging to Bismuth-based 2212, 2223, or Yttrium-based 123 compounds $MgB_2$ Based superconducting wires. Since magnets that use these materials are still in the developmental stages they are not further mentioned in the discussions here.

BRIEF DESCRIPTION OF THE DRAWINGS

FIG. 1 illustrates a cross-sectional view through a multifilamentary wire of the prior art.

FIG. 2 illustrates a cross-sectional view through a reinforced wire of this invention in which steel takes the form of a sheath around the outer surface of the superconductor-copper composite wire.

DESCRIPTION OF THE PREFERRED EMBODIMENT(S)

Figure 3:
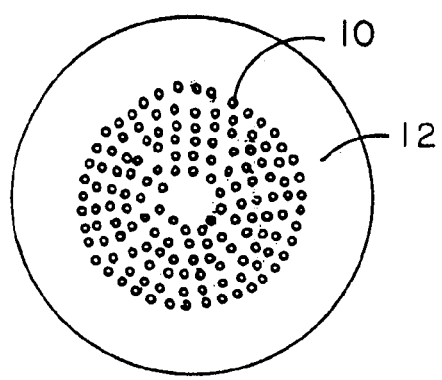
FIG. 3 illustrates a cross-sectional view through a prior art conductor configuration with a known superconducting current carrying capacity and mechanical strengths.

FIG. 1 illustrates a cross-sectional view of prior art composite wires 10 made of filamentary Nb—Ti or $Nb_3Sn$ within a copper or copper alloy matrix 12. FIG. 2 illustrates a cross-sectional view of a similar-wire to that of FIG. 1 but surrounded with stainless steel reinforcing material 14. The steel takes the form of a sheath over the composite wire. This arrangement differs from that of the so-called cable-in-conduit superconductor (CiCC) in that no void space unfilled with metal is left in the cross section. Where the superconductor is composed of Nb—Ti, manufacturing processes can include the following: Nb—Ti-copper composite wire of a given diameter and length is clad by a given layer of steel by folding a continuous sheet of the steel. In some applications the seam of the folded sheet of steel may be welded by a continuous operation. The steel cladding is then drawn over the Nb—Ti-copper wire to provide intimate contact and achieve a final target diameter and geometry. For $Nb_3Sn$ wires the cladding procedure is the same as above but the steel cladding is put on the $Nb_3Sn$ precursor wire before heat treatment. Therefore in the steel selection one should be mindful of the effect of heat treatment on the properties of the particular steel and inter-diffusion of element of the cladding and the core $Nb_3Sn$ wire, and its magnetic properties.

For reasons relating to particular resistivity of the cladding, and/or compatibility of the cladding material with the core material during heat treatment, and relative mechanical behavior the cladding and the core, the choice of cladding materials may be among molybdenum, niobium, vanadaium, tantalum, or their alloys. For example, molybdenum is particularly useful for cladding of $Nb_3Sn$ wires as it has no appreciable mutual solubility with copper and doesn't react with typical $Nb_3Sn$ wires during their reaction heat treatment. In addition, molybdenum has a relatively high elastic modulus and is particularly effective in reinforcing magnets made from $Nb_3Sn$ or any other superconducting wire.

Aside from benefits in mechanical performance of magnets, a reinforcing cladding may improve the stability of some magnets. A stable adiabatic magnet must have no sources of temperature excursion greater than the temperature margin of operation. It is known that temperature perturbations arise from cracking of epoxy impregnation or frictional movement between a winding and its surrounding form. Temperature rise may also result from the decay of induced shielding currents, but that is a negligible effect during normal charge. The elimination or at least the minimization of these triggers is essential in the design and construction of the magnet. The specification of the temperature margin has hitherto been based principally on design experience. The quantitative specification of temperature margin which usually is specified as the margin between operating current and critical current is complex, because the perturbations that may cause temperature excursions are ill defined. However, in the present invention the use of a generous amount of a high residual resistivity ratio (RRR) normal conductor, e.g. copper, is not essential for stability, and furthermore, it is not essential or even desirable, for quench protection. For example, in the case where a central core containing the superconducting filaments is surrounded by a low RRR copper sheath, which in turn is surrounded by a high-strength reinforcement and where a frictional or mechanical perturbation occurs at the outer surface of this combination, the high-strength sheath acts to provide high thermal resistance. The heat generated at its outer surface diffuses slowly inwards and meets the low RRR copper annulus. This conductor has high conductivity so that the heat issuing from the reinforcement diffuses axially as well as radially. This heat diffusion results in a much attenuated heat pulse entering the core. Although the copper sheath provides little longitudinal electrical conductivity, because its RRR is low, its relative conductivity is still high when compared with the matrix of the core. Thus, this combination will provide almost as good a stabilizing effect as a high RRR sheath. It is important to note that, with one exception, all perturbations produce heat pulses which diffuse inwards from the outside of the conductor, not from the core outwards. The exception is a flux jump caused by the collapse of shielding currents, but such an event is rare in a wire of appropriate twist pitch. Thus, if a perturbation occurs which raises the temperature of the superconducting filaments to just below the current sharing temperature, no current flows in the copper. If, however, the temperature exceeds the current sharing temperature, then current will flow in the copper. Whether the superconductor recovers from the subsequent transient then depends largely on the thermal conductivity of the copper, because longitudinal heat transport is then the only mechanism that can remove heat faster than it is generated. Thus, a composite conductor that includes both (1) a high-strength, high-resistivity cladding and (2) copper positioned in between the cladding and the superconducting filaments is preferred for optimized adiabatic superconducting coils.

Figure 4:
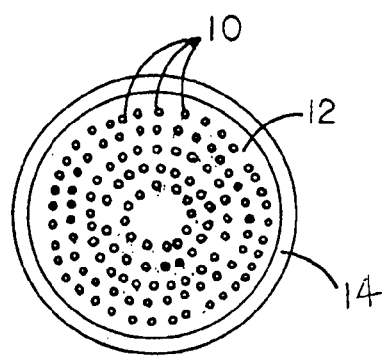
FIG. 4 illustrates a cross-sectional view of the steel-clad superconducting wire of this invention of equivalent strength to the prior art wire of FIG. 3.

Essential to the composition of the conductor is a sufficient normal conductor to provide the necessary quench protection. A combination of structure and stabilizer to be incorporated into the conductor could be, for example, stainless steel 316LN that has high elastic modulus, 200 GPa and high yield strength (up to 1.6 GPa for fully hard wires) and therefore much less of it is required to provide the same structural support as hard copper (elastic modulus of 130 GPa and strength of 0.4 Gpa). As an example of the use of the composite superconducting wire of this invention, first consider the prior art conductor that was used in the largest Nb—Ti coils of the 600 MHz magnet designed and built by J. Williams [J. E. G. Williams, S. Pourrahimi, Y. Iwasa, and L. J. Neuringer, "*A 600 MHz Spectrometer Magnet,*" *IEEE Trans.* Vol. Mag-25, pp. 1767-1770, 1989]. The cross-section of this conductor is depicted in FIG. 3. The copper/superconductor ratio is 4/1. As an alternative the present invention provides the conductor shown in FIG. 4. This conductor has a core with a superconductor/copper ratio of 1/1 which has a stainless steel 316LN cladding 14. The conductors shown in FIGS. 3 and 4 have equivalent mechanical properties and superconducting critical properties, that is, they can carry the same current at various fields, but the overall area of the conductor of this invention is about half that of the prior art conductor illustrated in FIG. 3. Thus, by using the conductor of this invention the same ampere/turns can be achieved in a winding pack that is half as thick and weighs about half as much as the prior art conductor.

Figure 5:
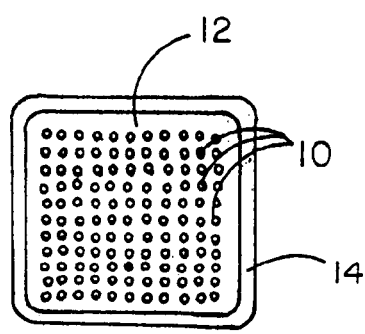
FIG. 5 illustrates a cross-sectional view of another embodiment of the steel-clad superconducting wire of this invention having a different cross-sectional shape.

The use of superconducting wires having a square, or low aspect ratio rectangular, cross section has become a choice for fabrication of high performance NMR and MRI magnets. The conductor configuration illustrated in FIG. 5 has an equivalent cross-sectional area as that of the conductor illustrated in FIG. 4 but can achieve a higher overall critical current density for a given winding pack thickness, and is mechanically more robust.

Figure 6:
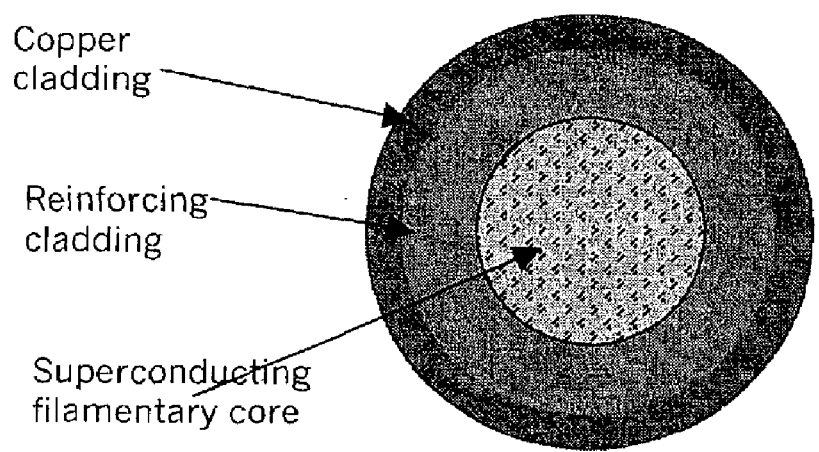
FIG. 6 illustrates a cross-sectional view through a multifilamentary superconducting wire with a reinforcing cladding and a high conductivity cladding.

If in a particular application the design calls for high conductivity material on the surface of the wire, the reinforced wire, that is conductor with high strength cladding, may be clad with a high conductivity material like copper in a secondary process. FIG. 6, shows a conductor with both a reinforcing cladding and a high conductivity cladding.

In some applications of square or rectangular wires it may be preferred for the cladding to surround the wire partially.

In some application a number of wires may be cabled together to manufacture a large mass superconductor. The cable may be clad with a choice reinforcing material and then the clad-cable may be compacted, for example, by drawing to form effectively a singular wire. In another embodiment the cable of wires may be compacted, for example by drawing, and then clad with a choice reinforcing material.

Although the discussion in the above often use NMR and MRI magnets as examples the benefits of reinforcement by cladding of wires with high strength materials is useful to many other superconducting magnets including those used for example in gyrotrons, cyclotrons, and particle beam focusing devices.

Although the present invention has been described with reference to particular embodiments, it will be apparent to those skilled in the art that variations and modifications can be substituted therefor without departing from the principles and spirit of the invention.

We claim:

1. A method of manufacturing a compact single clad superconducting wire having a markedly reduced cross-sectional area, said method of manufacture comprising the steps of:
   providing a workpiece fashioned as a nearly complete single superconducting wire which has been drawn to nearly its prechosen final dimensions, said nearly complete single superconducting wire workpiece comprising
   (a) a one discrete metallic matrix composed of pure metal or metal alloy, and
   (b) multiple filaments of superconducting matter individually contained within and encompassed by said metallic matrix;
   covering said nearly complete single superconducting wire workpiece with at least one cladding of material to form a clad single surerconducting wire workpiece, wherein said cladding material
   (i) completely surrounds said nearly complete superconducting wire workpiece, and
   (ii) is a high-strength reinforcing substance of high resistance and low thermal conductivity having a mechanical yield strength and an elastic modulus greater than that of pure copper; and then
   drawing said clad single superconducting wire workpiece into its prechosen final dimensions to produce a compact clad superconducting wire having a markedly reduced cross-sectional area without forming voids between said cladding material and said single superconducting wire workpiece.

2. The method of claim 1 further comprising the step of:
   forming said cladding using a material selected from the group consisting of iron and its alloys, nickel and its alloys, superalloy and stainless steel alloy.

3. The method of claim 1 further comprising the step of:
   forming said cladding using a material selected from the group consisting of molybdenum and its alloys, niobium and its alloys, vanadaium and its alloys, and tantalum and its alloys.

4. The method of claim 1 further comprising the step of:
   forming said multiple filaments contained within said metallic matrix of said nearly complete single superconducting wire workpiece using a niobium-tin compound.

5. The method of claim 1 further comprising the step of forming said multiple filaments contained within said metallic matrix of said nearly complete single superconducting wire workpiece using a niobium-titanium alloy.

6. The method of claim 1 further comprising the step of forming said compact clad single superconducting wire into a shape having a circular cross-section.

7. The method of claim 1 further comprising the step of forming said compact clad single superconducting wire into a shape having a rectangular cross-section.

8. The method of claim 1 further comprising the step of forming said metallic matrix of said nearly complete single superconducting wire workpiece using a substance selected from the group consisting of copper and copper alloys.

9. The method of claim 1 further comprising the step of surrounding said nearly complete single superconducting wire workpiece by folding a continuous sheet of said high-strength reinforcing material around said single superconducting wire workpiece.

10. The method of claim 1 further comprising the steps of surrounding said nearly complete single superconducting wire workpiece by folding a continuous sheet of the said high-strength reinforcing material around said single superconducting wire workpiece; and then welding the seam of said folded continuous sheet.

11. A method of manufacturing a compact single clad superconducting wire having a markedly reduced cross-sectional area; said method of manufacture comprising the steps of:
    providing a workpiece fashioned as a nearly complete single superconducting wire which has been drawn to nearly its prechosen final dimensions, said nearly complete single superconducting wire workpiece comprising less than a 4:1 ratio of
    (a) one discrete metallic matrix composed of pure metal or metal alloy, and
    (b) multiple filaments of superconducting matter individually contained whithin and encompassed by said metallic matrix;
    covering said nearly complete single superconducting wire workpiece with at least one cladding of material to form a clad single superconducting wire workpiece, wherein said cladding material
    (i) completly surrounds said nearly complete superconducting wire, and
    (ii) is a high-strength reinforcing substance of high resistance and low thermal conductivity having a mechanical yeild strength and an elastic modulus greater than that of pure copper; and then
    drawing said clad single superconducting wire workpiece into its prechosen final dimensions to produce a compact clad superconducting wire having a markedly reduced cross-section area without forming voids between said cladding material and said single superconducting wire workpiece.

12. The method of claim 11 further comprising step of: forming said cladding using a material selected from the group consisting of iron and its alloys, nickel and its alloys, superalloy and stainless steel alloy.

13. The method of claim 11 further comprising step of: forming said cladding using a material selected from the group consisting of molybdenum and its alloys, niobium and its alloys, vanadaium and its alloys, and tantalum and its alloys.

14. The method of claim 11 further comprising step of: forming said multiple filaments contained within said metallic matrix of said nearly complete single superconducting wire workpiece using a niobium-tin compound.

15. The method of claim 11 further comprising step of: forming said multiple filaments contained within said metallic matrix of said nearly complete single superconducting wire workpiece using a niobium-titanium alloy.

16. The method of claim 11 further comprising step of forming said compact clad single superconducting wire into a shape having a circular cross-section.

17. The method of claim 11 further comprising step of forming said compact clad single superconducting wire into a shape having a rectangular cross-section.

18. The method of claim 11 further comprising step of forming said metallic matrix of said nearly complete single superconducting wire workpiece using a substance selected from the group consisting of copper and copper alloys.

19. The method of claim 11 further comprising step of surrounding said nearly complete single superconducting wire workpiece by folding a continuous sheet of said high-strength reinforcing material around said single superconducting wire workpiece.

20. The method of claim 11 further comprising steps of surrounding said nearly complete single superconducting wire workpiece by folding a continuous sheet of the said high-strength reinforcing material around said single superconducting wire workpiece; and then welding the seam of said folded continuous sheet.

* * * * *